(12) United States Patent
Liao

(10) Patent No.: US 12,074,357 B2
(45) Date of Patent: Aug. 27, 2024

(54) ELECTROMAGNETIC WAVE TRANSMISSION BOARD COMPRISING AN INNER BOARD WITH A PLATED THROUGH HOLE COVERED BY OUTER PLATES, WHERE THE ELECTROMAGNETIC WAVES PROPAGATE IN THE THROUGH HOLE WITHOUT LEAKAGE

(71) Applicant: BOARDTEK ELECTRONICS CORPORATION, Taoyuan (TW)

(72) Inventor: Chung-Hsing Liao, Taoyuan (TW)

(73) Assignee: BOARDTEK ELECTRONICS CORPORATION, Taoyuan (TW)

( * ) Notice: Subject to any disclaimer, the term of this patent is extended or adjusted under 35 U.S.C. 154(b) by 504 days.

(21) Appl. No.: 17/389,605

(22) Filed: Jul. 30, 2021

(65) Prior Publication Data
US 2023/0025696 A1    Jan. 26, 2023

(30) Foreign Application Priority Data
Jul. 21, 2021    (TW) .................. 110126882

(51) Int. Cl.
*H01P 3/12*    (2006.01)
*H01P 5/107*    (2006.01)
(Continued)

(52) U.S. Cl.
CPC .............. *H01P 3/121* (2013.01); *H01P 5/107* (2013.01); *H01Q 9/045* (2013.01); *H05K 1/0218* (2013.01); *H05K 1/0298* (2013.01); *H05K 1/18* (2013.01); *H05K 3/243* (2013.01); *H05K 3/429* (2013.01); *H05K 3/4652* (2013.01); *H05K 3/4664* (2013.01); *H05K 3/4697* (2013.01); *H05K 2201/0367* (2013.01); *H05K 2201/0723* (2013.01); *H05K 2201/09981* (2013.01); *H05K 2201/09985* (2020.08);
(Continued)

(58) Field of Classification Search
CPC .. H01P 5/02; H01P 5/024; H01P 5/107; H01P 3/121; H01P 3/12; H01P 3/082; H01P 3/088
USPC ....................................................... 333/248
See application file for complete search history.

(56) References Cited

U.S. PATENT DOCUMENTS

| | | | |
|---|---|---|---|
| 6,535,088 B1 * | 3/2003 | Sherman et al. ...... | H05K 1/024 333/246 |
| 2011/0140979 A1 * | 6/2011 | Dayan et al. ........... | H01P 3/121 333/208 |
| 2013/0057365 A1 * | 3/2013 | Mizushima et al. ........ | H05K 1/0239 333/238 |

FOREIGN PATENT DOCUMENTS

TW         202017441 A     5/2020

* cited by examiner

*Primary Examiner* — Benny T Lee
(74) *Attorney, Agent, or Firm* — ScienBiziP, P.C.

(57) ABSTRACT

An electromagnetic wave transmission board proofed against internal signal leakage includes an inner plate, a first outer plate, a second outer plate, a first plate bump, a first conductive bump, a second plate bump, and a second conductive bump. The inner plate defines a first through hole with a plated metal layer on the hole wall. The first and second plated bumps are disposed between the first outer and inner plates. The second plate bump and the second conductive bump are disposed between the second outer plate and the inner plate. The plate metal layer, the first plate bump, the first conductive bump, the first outer plate, the second outer plate, the second conductive bump, and the
(Continued)

second plated bump jointly form an air-filled chamber. A method for manufacturing the electromagnetic wave transmission board is also provided.

19 Claims, 8 Drawing Sheets

(51) Int. Cl.
*H01Q 9/04* (2006.01)
*H05K 1/02* (2006.01)
*H05K 1/18* (2006.01)
*H05K 3/24* (2006.01)
*H05K 3/42* (2006.01)
*H05K 3/46* (2006.01)

(52) U.S. Cl.
CPC .............. *H05K 2201/10098* (2013.01); *H05K 2201/10507* (2013.01); *H05K 2203/0723* (2013.01)

ELECTROMAGNETIC WAVE TRANSMISSION BOARD COMPRISING AN INNER BOARD WITH A PLATED THROUGH HOLE COVERED BY OUTER PLATES, WHERE THE ELECTROMAGNETIC WAVES PROPAGATE IN THE THROUGH HOLE WITHOUT LEAKAGE

FIELD

The subject matter herein generally relates to a composite board, especially to an electromagnetic wave transmission board for transmitting electromagnetic wave signal and a method for manufacturing the same.

BACKGROUND

A composite board, for transmitting electromagnetic wave signals is provided with a cavity therein, through which the electromagnetic wave is transmitted. Such composite board is obtained by laminating two outer plates on both sides of an inner plate with a through hole, the two outer plates covering both ends of the through hole. However, in the lamination process of the composite board, the adhesives that connect the outer plates and the inner plate may flow into the through hole, and the adhesive does not block the electromagnetic wave signals transmitted through the cavity.

BRIEF DESCRIPTION OF THE DRAWINGS

Implementations of the present technology will now be described, by way of embodiment, with reference to the attached figures.

FIG. 5B-2 is a bottom view of a first substrate according to a second embodiment of the present disclosure.

DETAILED DESCRIPTION OF THE INVENTION

Figure 1A:
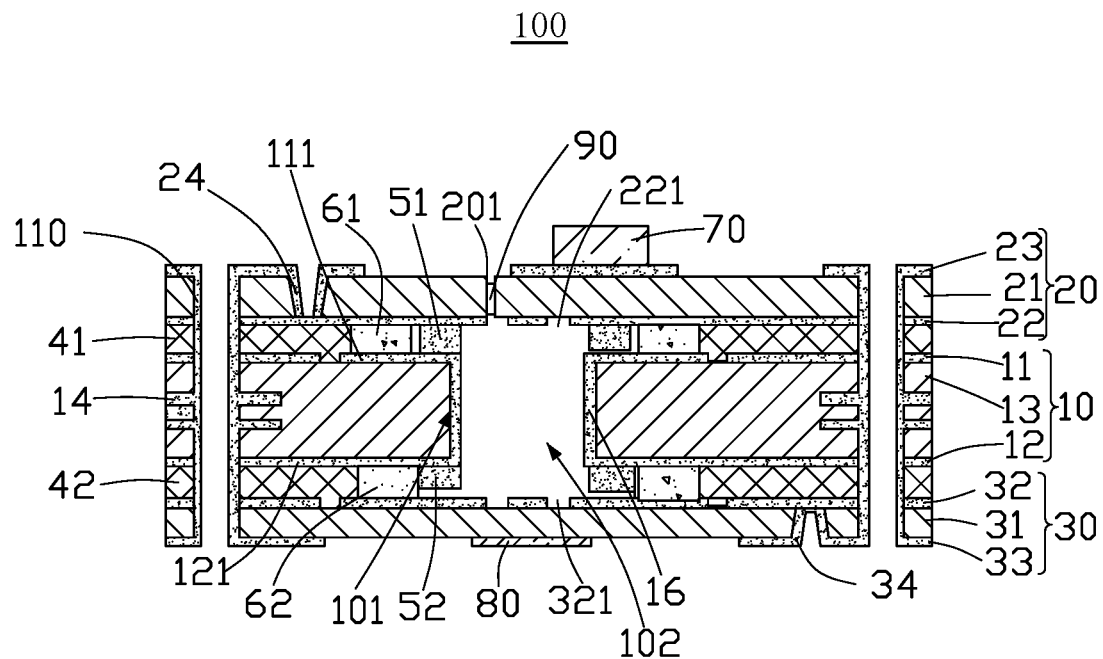
FIG. 1A is a cross-sectional view of an electromagnetic wave transmission board according to a first embodiment of the present disclosure.

It will be appreciated that for simplicity and clarity of illustration, where appropriate, reference numerals have been repeated among the detailed description of the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein.

The term "comprising," when utilized, means "including, but not necessarily limited to"; it specifically indicates open-ended inclusion or membership in the so-described combination, group, series, and the like. When a first component is referred to as "connecting" to a second component, it is intended that the first component may be directly connected to the second component or may be indirectly connected to the second component via a third component between them.

Referring to FIG. 1A, a first embodiment of the present disclosure provides an electromagnetic wave transmission board 100, which includes an inner plate 10, a first outer plate 20, a second outer plate 30, a first adhesive layer 41, a second adhesive layer 42, a first plated bump 51, a second plated bump 52, a first conductive bump 61, and a second conductive bump 62.

The inner plate 10 includes a first conductive layer 11 and a second conductive layer 12 which are located on the outside and an insulating layer 13 located between the first conductive layer 11 and the second conductive layer 12. The first conductive layer 11 and the second conductive layer 12 are disposed opposite to each other. In some embodiments, the inner plate 10 has a multilayer structure, the inner plate 10 may further include third conductive layers 14 located between the first conductive layer 11 and the second conductive layer 12, and two adjacent conductive layers in the inner plate 10 are separated from each other by the insulating layer 13.

The inner plate 10 defines a first through hole 101 which penetrates through the first conductive layer 11, the second conductive layer 12, and the insulating layer 13. A plated metal layer 16 is disposed on the hole wall of the first through hole 101. The first conductive layer 11 includes a first shielding portion 111 adjacent to the first through hole 101, and the second conductive layer 12 includes a second shielding portion 121 adjacent to the first through hole 101. The first shielding portion 111 and the second shielding portion 121 are connected to opposite ends of the plated metal layer 16.

The first outer plate 20 and the second outer plate 30 are disposed on the first conductive layer 11 and the second conductive layer 12 and respectively cover the opposite ends of the first through hole 101. The first outer plate 20, the second outer plate 30, and the inner plate 10 are combined by a lamination process.

The first outer plate 20 includes a first base layer 21, and a first conductive circuit layer 22 and a second conductive circuit layer 23 which are disposed on opposite surfaces of the first base layer 21. The first outer plate 20 further includes a first conductive structure 24 which electrically connects the first conductive circuit layer 22 and the second conductive circuit layer 23. In the embodiment, the first conductive structure 24 is a conductive hole.

The second outer plate 30 includes a second base layer 31, and a third conductive circuit layer 32 and a fourth conductive circuit layer 33 which are disposed on opposite surfaces of the second base layer 31. The second outer plate 30 further includes a second conductive structure 34 which electrically connects the third conductive circuit layer 32 and the fourth conductive circuit layer 33. In the embodiment, the second conductive structure 34 is a conductive hole.

The materials of the insulating layer 13, the first base layer 21, and the second base layer 31 can be rigid, such as glass fiber prepreg, carbon fiber prepreg, epoxy resin, etc. The materials of the insulating layer 13, the first base layer 21, and the second base layer 31 can also be flexible materials, such as polyester, polyimide, etc.

The first plated bump 51 is disposed between the first conductive layer 11 and the first conductive circuit layer 22 and surrounds the first through hole 101. The first plated bump 51 is formed on the first conductive circuit layer 22 by electroplating, so that the first plated bump 51 is closely combined with the first conductive circuit layer 22. One end of the first plated bump 51 away from the first conductive circuit layer 22 is in contact with or not in contact with the first conductive layer 11. The first conductive bump 61 is sandwiched between the first conductive layer 11 and the first conductive circuit layer 22 and surrounds the first plated bump 51. The first conductive bump 61 and the first plated bump 51 may be spaced from each other or connected to each other. The first conductive bump 61 is formed on the first conductive layer 11 by a printing process, so that the first conductive bump 61 is closely combined with the first conductive layer 11. One end of the first conductive bump 61 away from the first conductive layer 11 is in contact with the first conductive circuit layer 22 by a lamination process. In the embodiment, the first conductive bump 61 is disposed on the first shielding portion 111.

The second plated bump 52 is disposed between the second conductive layer 12 and the third conductive circuit layer 32 and surrounds the first through hole 101. The second plated bump 52 is formed on the second conductive layer 12 by electroplating, so that the second plated bump 52 is closely combined with the second conductive layer 12. One end of the second plated bump 52 away from the second conductive layer 12 is in contact with or not in contact with the third conductive circuit layer 32. The second conductive bump 62 is sandwiched between the second conductive layer 12 and the third conductive circuit layer 32 and surrounds the second plated bump 52. The second conductive bump 62 and the second plated bump 52 may be spaced from each other or connected to each other. The second conductive bump 62 is formed on the third conductive circuit layer 32 by a printing process, so that the second conductive bump 62 is closely combined with the third conductive circuit layer 32. One end of the second conductive bump 62 away from the third conductive circuit layer 32 is in contact with the second conductive layer 12 by a lamination process. In the embodiment, the second conductive bump 62 is disposed on the second shielding portion 121.

In some embodiments, the electromagnetic wave transmission board 100 further includes a plurality of first plated bumps 51, a plurality of second plated bumps 52, a plurality of first conductive bumps 61, and a plurality of second conductive bumps 62. The first plated bumps 51 are arranged at intervals and surround the first through hole 101. The second plated bumps 52 are arranged at intervals and surround the thorough hole 101. The first conductive bumps 61 are arranged at intervals and surround the plurality of first plated bumps 51. The second conductive bumps 62 are arranged at intervals and surround the second plated bumps 52.

In some embodiments, the first plated bump 51 and the second plated bump 52 each have a thickness of 30 micrometers to 80 micrometers and a width of 0.2 millimeters to 0.5 millimeters, and the first conductive bump 61 and the second conductive bump 62 each have a thickness of 0.008 millimeters to 0.125 millimeters and a width of 0.25 millimeters to 0.35 millimeters.

In some embodiments, the materials of the first conductive bump 61 and the second conductive bump 62 are conductive paste.

The first conductive circuit layer 22 of the first outer plate 20, the first plated bump 51, the first conductive bump 61, the first shielding portion 111 of the first conductive layer 11, the plated metal layer 16, the second shielding portion 121 of the second conductive layer 12, the second plated bump 52, the second conductive bump 62, and the third conductive circuit layer 32 of the second outer plate 30 collectively form a chamber 102. The medium in the chamber 102 is air, and the electromagnetic wave transmission board 100 can transmit the electromagnetic wave signal through the air in the chamber 102 as a conductive medium. The first plated bump 51, the first conductive bump 61, the first shielding portion 111, the plated metal layer 16, the second shielding portion 121, the second plated bump 52, and the second conductive bump 62 block the electromagnetic wave signal transmitted in the chamber 102, thereby providing an electromagnetic shield.

Since the first plated bump 51 is formed on the first conductive circuit layer 22 of the first outer plate 20 by electroplating, and the first conductive bump 61 is formed on the first conductive layer 11 of the inner plate 10 by printing, the electromagnetic wave signal transmitted in the chamber 102 cannot leak from the interface between the first plated bump 51 and the first outer plate 20 and from the interface between the first conductive bump 61 and the inner plate 10, so as to reduce the leakage of the electromagnetic wave signal from the space between the first outer plate 20 and the inner plate 10. Since the second plated bump 52 is formed on the second conductive layer 12 of the inner plate 10 by electroplating, and the second conductive bump 62 is formed on the third conductive circuit layer 32 of the second outer plate 30 by printing, the electromagnetic wave signal transmitted in the chamber 102 cannot leak from the interface between the second plate bump 52 and the inner plate 10 and from the interface between the second conductive bump 62 and the second outer plate 30, so as to reduce the leakage of the electromagnetic wave signal from the space between the second outer plate 30 and the inner plate 10.

In other embodiments, the first plated bump 51 may be formed on the inner plate 10 by electroplating, and the end of the first plated bump 51 away from the inner plate 10 is in contact with or not in contact with the first outer plate 20. At the same time, the first conductive bump 61 is formed on the first outer plate 20 by printing, the end of the first conductive bump 61 away from the first outer plate 20 being in contact with the inner plate 10 by a lamination process. The second plated bump 52 is formed on the second outer plate 30 by electroplating, the end of the second plated bump 52 away from the second outer plate 30 is in contact with or not in contact with the inner plate 10. At the same time, the second conductive bump 62 is formed on the inner plate 10 by printing, the end of the second conductive bump 62 away from the inner plate 10 is in contact with the second outer plate 30 by a lamination process.

The first conductive circuit layer 22 defines a first groove 221. A portion of the first base layer 21 is exposed from the first groove 221. The third conductive circuit layer 32 defines a second groove 321 exposing a portion of the second base layer 31. The first groove 221 and the second groove 321 are each in communication with the chamber 102. The chamber 102 receives and outputs an electromagnetic wave signal through the first groove 221 and the second groove 321 respectively.

The first adhesive layer 41 is sandwiched between the first outer plate 20 and the inner plate 10 and located on a side of the first conductive bump 61 away from the first plated bump 51. The first adhesive layer 41 bonds the first outer plate 20 and the inner plate 10. The first conductive bump 50 blocks the first adhesive layer 41 from flowing into the chamber 102.

The second adhesive layer 42 is sandwiched between the second outer plate 30 and the inner plate 10 and located on a side of the second conductive bump 62 away from the second plated bump 52. The second adhesive layer 42 bonds the second outer plate 30 and the inner plate 10. The second conductive bump 62 blocks the second adhesive layer 42 from flowing into the chamber 102.

The first outer plate 20 further defines a second through hole 201. The chamber 102 is in communication with an external space through the second through hole 201. In the assembling process of the electromagnetic wave transmission board 100, air which is expanded due to high temperature in the cavity 102 escapes to the external space through the through hole 201. In the embodiment, the second through hole 201 is in communication with the first groove 221.

The electromagnetic wave transmission board 100 further includes a filler 90, which infills the through hole 201 to seal the chamber 102.

The electromagnetic wave transmission board 100 further includes a plated hole 110. The plated hole 110 penetrates the first outer plate 20, the first adhesive layer 41, the inner plate 10, the second adhesive layer 42, and the second outer plate 30 successively, and electrically connects the first outer plate 20, the inner plate 10, and the second outer plate 30.

The electromagnetic wave transmission board 100 further includes an active element 70 and an antenna 80. The active element 70 is arranged on the second conductive circuit layer 23. The antenna 80 is arranged on the surface of the second base layer 31 away from the inner layer plate 10 and is electrically connected with the fourth conductive circuit layer 33. The external electromagnetic wave signal received by the antenna 80 is transmitted to the active element 70 through the chamber 102, or the electromagnetic wave signal transmitted by the active element 70 is transmitted to the antenna 80 through the chamber 102. In some embodiments, the active element 70 and the antenna 80 each correspond in position to the chamber 102. The antenna 80 may be a patch antenna.

Figure 1B:
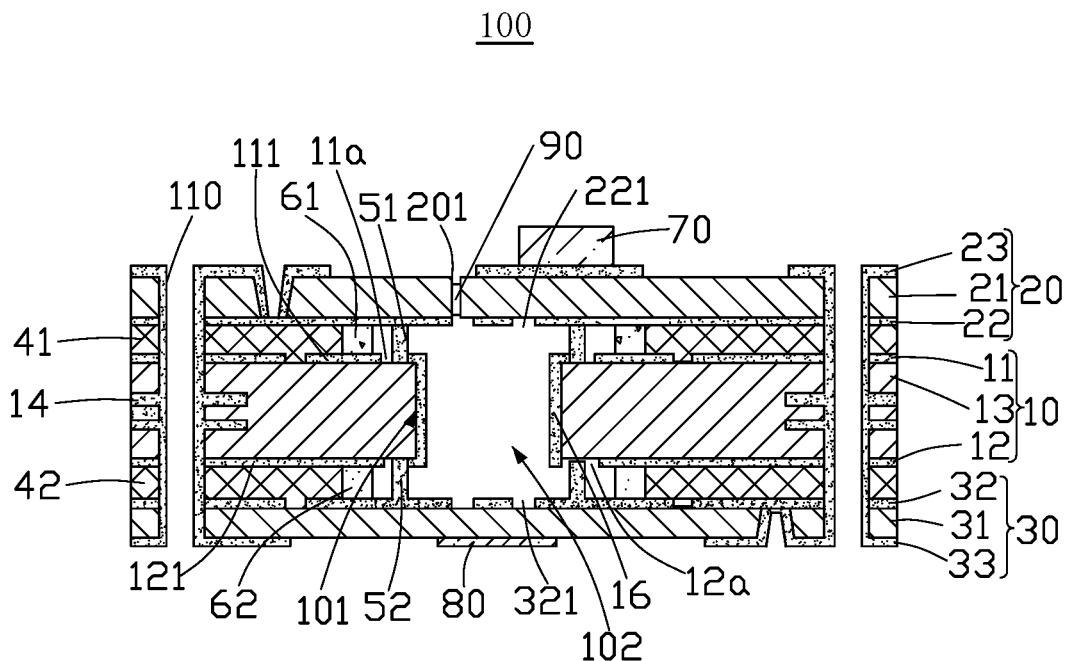
FIG. 1B is a cross-sectional view of an electromagnetic wave transmission board according to a second embodiment of the present disclosure.

Referring to FIG. 1B, in some embodiments, the first conductive layer 11 defines a third groove 11a, and the second conductive layer 12 defines a fourth groove 12a. The third groove 11a and the fourth groove 12a each expose a portion of the insulating layer 13. The first conductive bump 61 and the second conductive bump 62 are respectively formed on the first conductive layer 11 and the second conductive layer 12 by printing. The first plated bump 51 is formed on the first conductive circuit layer 22 by electroplating, and the end of the first plated bump 51 away from the first outer plate 20 is accommodated in the third groove 11a, and this further blocks the first adhesive layer 41 from flowing into the chamber 102. The second plated bump 52 is formed on the third conductive circuit layer 32 by electroplating, the end of the second plated bump 52 away from the second outer plate 30 is accommodated in the fourth groove 12a, and this further blocks the second adhesive layer 42 from flowing into the chamber 102. The width of each of the first plated bump 51 and the second plated bump 52 may be greater than 0.15 millimeters to 0.25 millimeters.

The present disclosure provides one embodiment of a method for manufacturing the electromagnetic wave transmission board 100. The method includes the following steps S1-S8.

Figure 2:
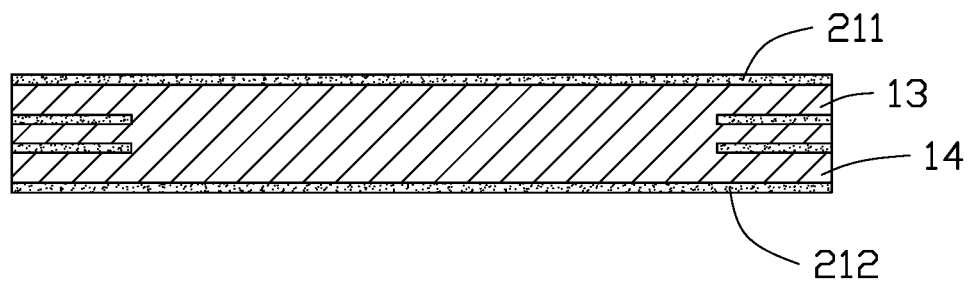
FIG. 2 is a cross-sectional view of a laminated structure of the board according to one embodiment of the present disclosure.

At step S1, referring to FIG. 2, a laminated structure 210 is provided. The laminated structure 20 includes a first metal layer 211, a second metal layer 212, together with a plurality of third conductive layers 14 and a plurality of insulating layers 13 located between the first metal layer 211 and the second metal layer 212. The third conductive layers 14, the first metal layer 211, and the second metal layer 212 are separated from each other by the insulating layers 13.

Figure 3:
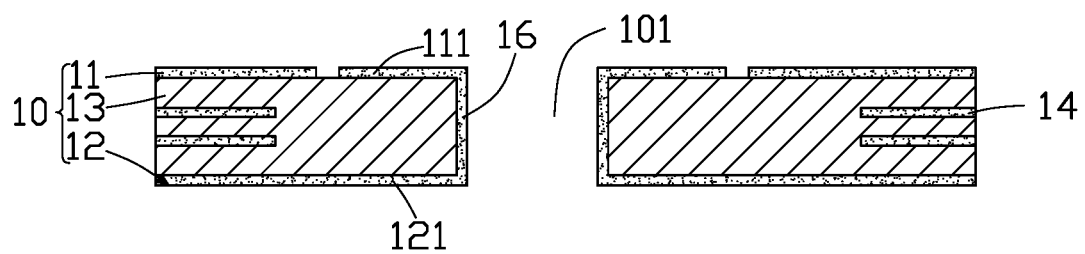
FIG. 3 is a cross-sectional view showing an inner plate formed from the laminated structure shown in FIG. 2.

At step S2, referring to FIG. 3, a first through hole 101 is formed on the laminated structure. A first conductive layer 11 and a second conductive layer 12 are respectively formed from the first metal layer and the second metal layer, and a plated metal layer 16 is formed on the hole wall of the first through hole 101 by electroplating, thereby obtaining the inner plate 10. The first conductive layer 11 includes the first shielding portion III adjacent to the first through hole 101, and the second conductive layer 12 includes the second shielding portion 121 adjacent to the first through hole 101.

Figure 4:
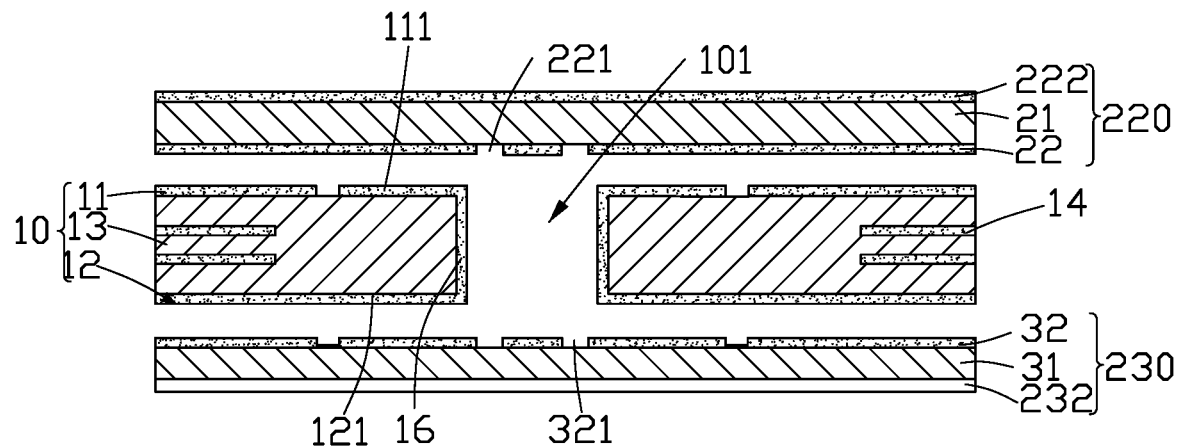
FIG. 4 is a cross-sectional view showing a first substrate and a second substrate provide on both sides of the inner plate shown in FIG. 3.

At step S3, referring to FIG. 4, a first substrate 220 and a second substrate 230 are provided on opposite sides of the inner plate 10.

The first substrate 220 includes the first base layer 21, the first conductive circuit layer 22 is disposed on a side of the first base layer 21, and a third metal layer 222 is disposed on other side of the first base layer 21. The first conductive circuit layer 22 includes the first groove 221 exposing a portion of the first base layer 21.

The second substrate 230 includes a second base layer 31. The third conductive circuit layer 32 is disposed on a side of the second base layer 31, and a fourth metal layer 232 is disposed on other side of the second base layer 31. The third conductive circuit layer 32 includes the second groove 321 exposing a portion of the second base layer 31.

Figure 5A:
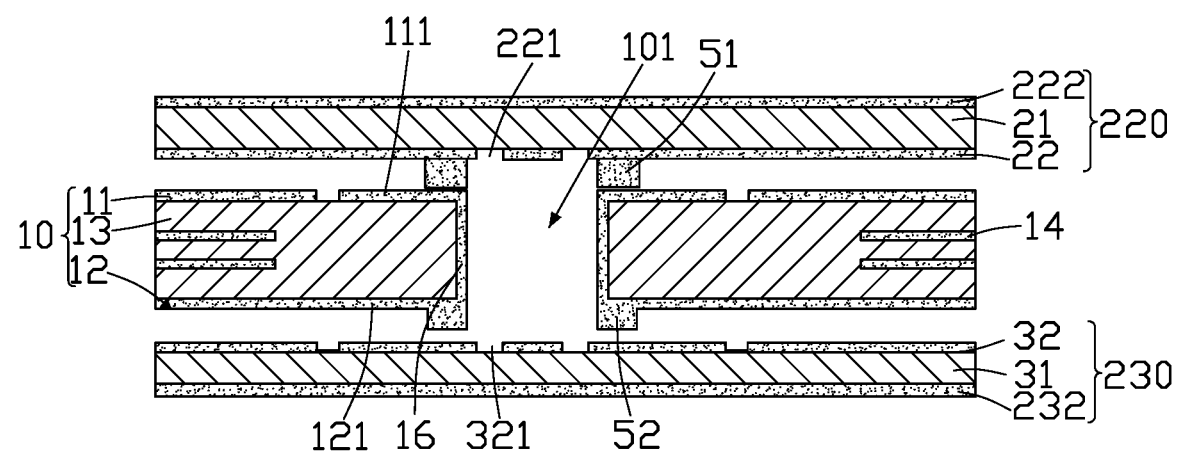
FIG. 5A is a cross-sectional view showing plated bumps formed on the first substrate and the inner plate shown in FIG. 4.

At step S4, referring to FIG. 5A, the first plated bump 51 is formed on the first conductive circuit layer 22 by electroplating, and the second plated bump 52 is formed on the second conductive layer 12 by electroplating.

Figures 1, 5B:
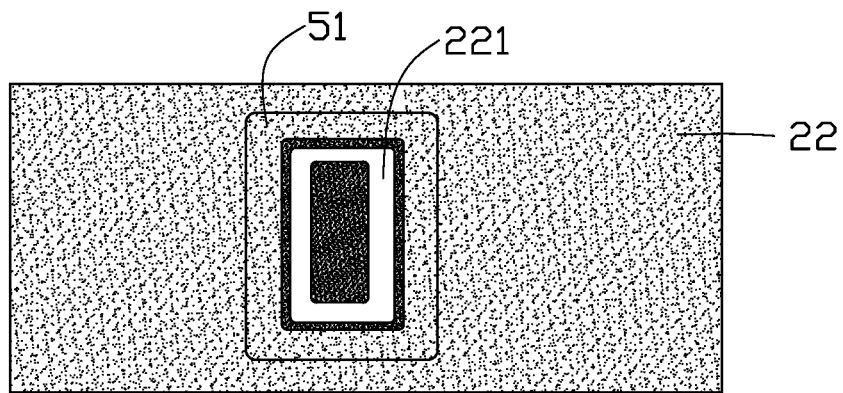
FIG. 5B-1 is a bottom view of a first substrate according to a first embodiment of the present disclosure.
Figures 2, 5B:
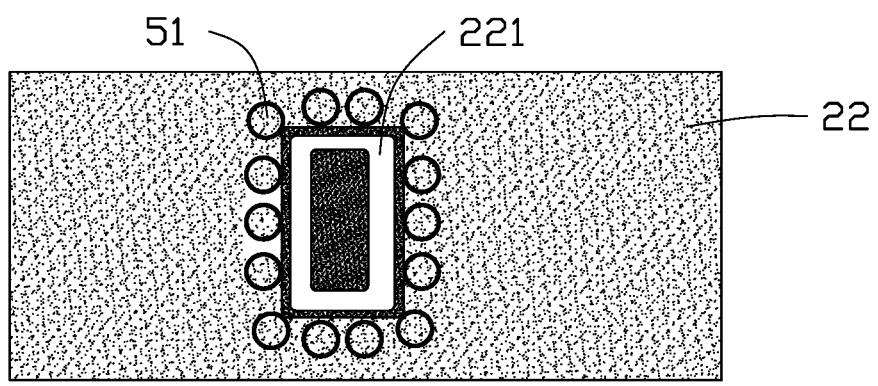

Referring to FIG. 5B-1, the first plated bump 51 is arranged on the first conductive circuit layer 22 in a ring-like structure in the shape of a closed rectangle. The second plated bump is also arranged on the second conductive layer in the same ring-like structure.

Referring to FIG. 5B-2, the first plated bumps 51 are formed in the ring-like structure on the first conductive circuit layer 22 by electroplating. The second plated bumps may also be electroplated on the second conductive layer, in the ring-like structure.

Figure 5C:
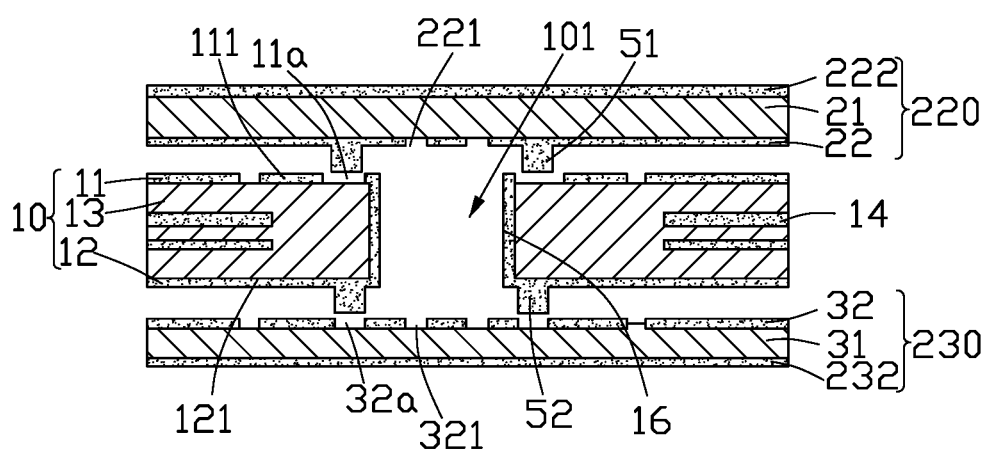
FIG. 5C is a cross-sectional view showing grooves formed on the inner plate and the second substrate shown in FIG. 5A.

Referring to FIG. 5C, the third groove 11a is formed on the first conductive layer 11, and the fourth groove 32a is formed on the third conductive circuit layer 32. The third groove 11a is configured to accommodate a portion of the first plated bump 51, and the fourth groove 32a is configured to accommodate a portion of the second plated bump 52.

Figure 6:
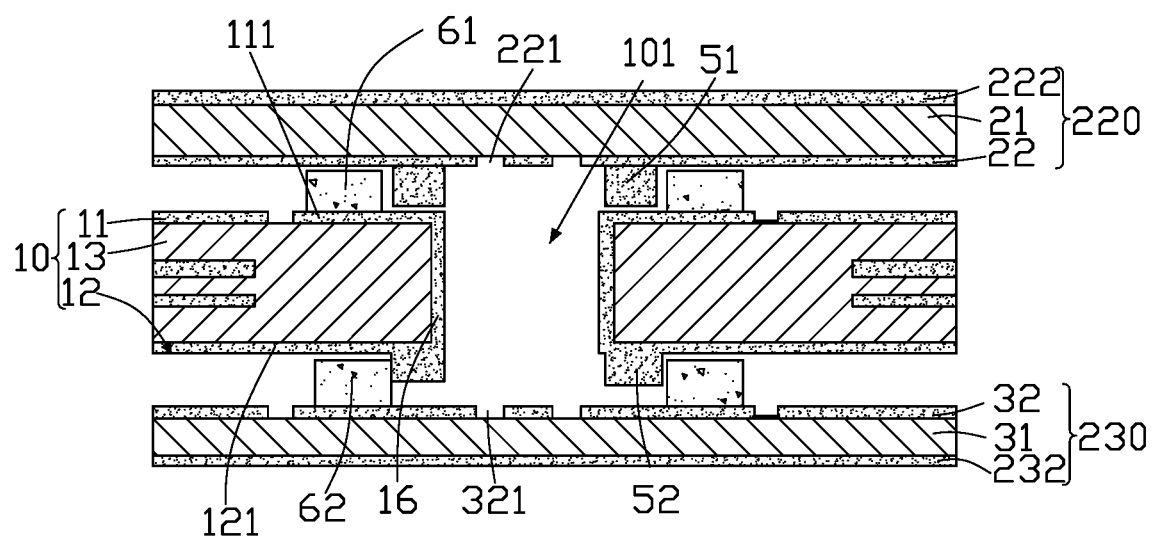
FIG. 6 is a cross-sectional view showing conductive bumps formed on the inner plate and the second substrate shown in FIG. 5A.
Figure 7:
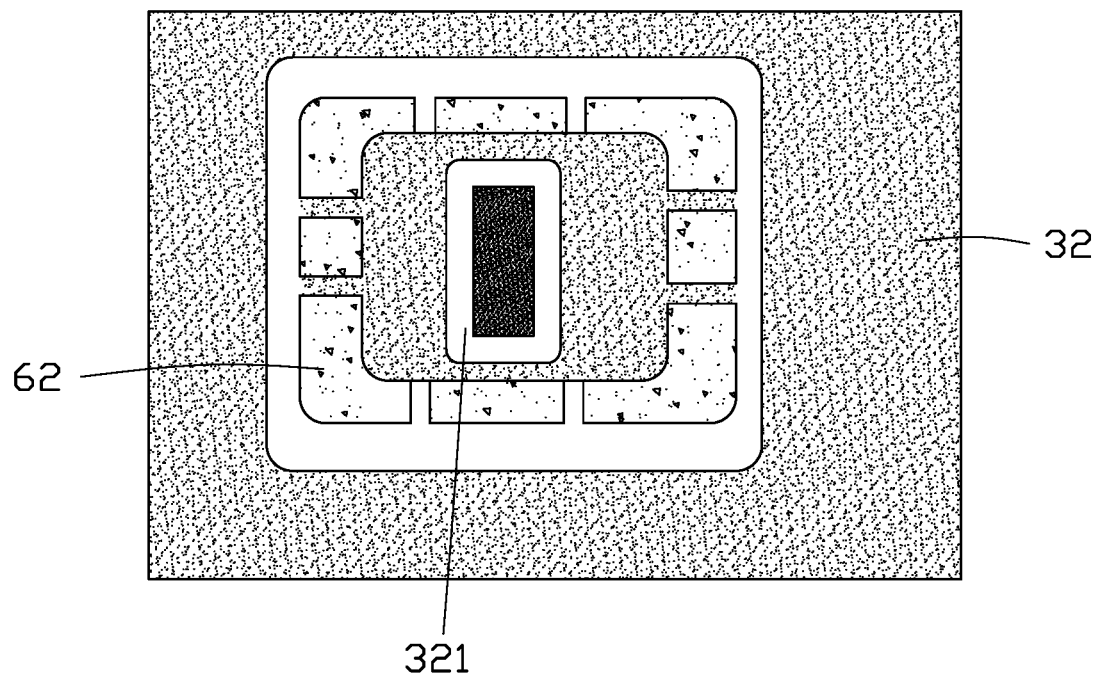
FIG. 7 is a top view of the second substrate shown in FIG. 6.

At step S5, referring to FIG. 6, the first conductive bump 61 and the second conductive bump 62 are respectively formed on the first conductive layer 11 and the third conductive circuit layer 31 by printing. The first conductive bump 61 and the second conductive bump 62 are each arranged in a ring. Referring to FIG. 7, second conductive bumps 62 are formed on the third conductive circuit layer 32 by printing, the second conductive bumps 62 are spaced from each other and arranged in a ring. First conductive bumps may also be electroplated on the first conductive layer, the first conductive bumps being spaced from each other and arranged in a ring.

Figure 8:
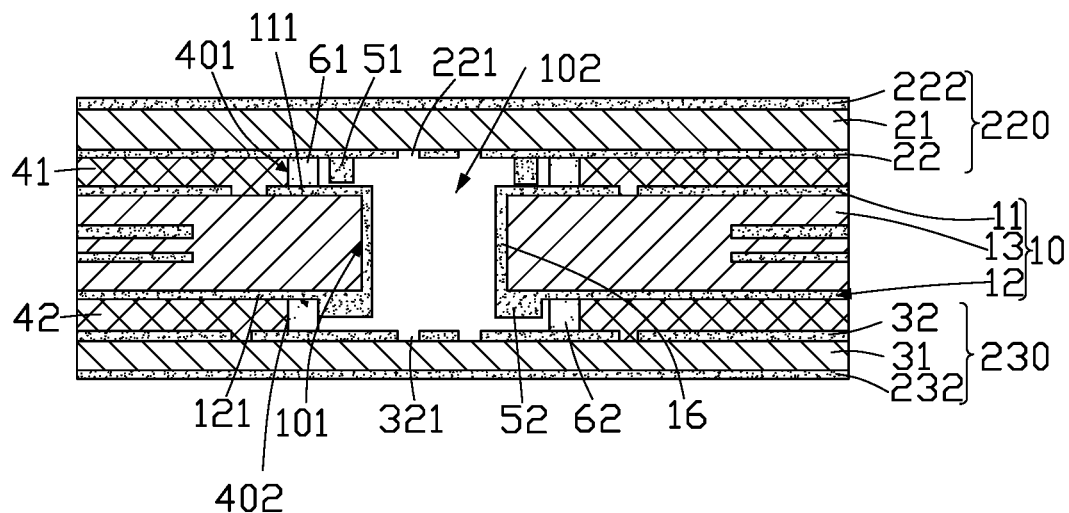
FIG. 8 is a cross-sectional view of FIG. 6 with the inner plate, the first substrate, and the second substrate laminated together.

At step S6, referring to FIG. 8, the first adhesive layer 41 and the second adhesive layer 42 are provided. Then the first substrate 220, the first adhesive layer 41, the inner plate 10, the second adhesive layer 42, and the second substrate 230 are laminated together in that order. The first adhesive layer 41 defines a first opening 401 which is used for the first conductive bump 61 and the first plated bump 51 to pass through during the lamination process. The second adhesive layer 42 defines a second opening 402 which is used for the second conductive bump 62 and the second plated bump 52 to pass through during the lamination process.

After being laminated together, the first plated bump 51 surrounds the first through hole 101, and the first conductive bump 61 surrounds the first plated bump 51. The end of the first conductive bump 61 away from the inner plate 10 is in contact with the first conductive circuit layer 22, the second plated bump 52 surrounds the first through hole 101, the second conductive bump 62 surrounds the second plated bump 61, and the end of the second conductive bump 62 away from the second substrate 230 is in contact with the second conductive layer 12. The first conductive circuit layer 22, the first plated bump 51, the first conductive bump 61, the first shielding portion 111 of the first conductive layer 11, the plated metal layer 16, the second shielding portion 121 of the second conductive layer 12, the second plated bump 52, the second conductive bump 62, and the third conductive circuit layer 32 collectively form chamber 102.

Figure 9:
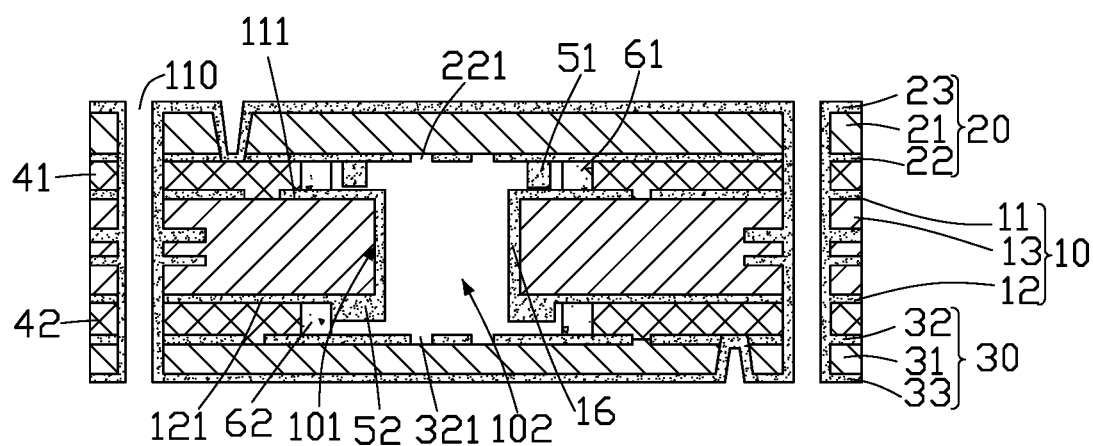
FIG. 9 is a cross-sectional view showing plated holes formed on the structure shown in FIG. 8.

At step S7, referring to FIG. 9, the second conductive circuit layer 23 and the fourth conductive circuit layer 33 are respectively formed from the third metal layer and the fourth layer to obtain the first outer plate 20 and the second outer plate 30. The plated hole 110, penetrating the first outer plate 20, the first adhesive layer 41, the inner plate 10, the second adhesive layer 42, and the second outer plate 30 in succession, is also formed.

At step S8, referring to FIG. 1A, the second through hole 201 is formed on the first outer plate 20, and the active element 70 and the antenna 80 are respectively assembled on the first outer plate 20 and the second outer plate 30, thereby obtaining the electromagnetic wave transmission board 100.

Referring to FIG. 1A and FIG. 1B, in the electromagnetic wave transmission board 100 and the manufacturing method, the arrangement of the first conductive bump 61 and the first plated bump 51 blocks the first adhesive layer 41 from the chamber 102. The arrangement of the second conductive bump 62 and the plated bump 52 blocks the second adhesive layer 42 from the chamber 102. One of the first conductive bump 61 and the first plated bump 51 is directly formed on one of the inner plate 10 and the first outer plate 20, and the other one of the first conductive bump 61 and the first plated bump 51 is directly formed on the other of the inner plate 10 and the first outer plate 20; one of the second conductive bump 62 and the second plated bump 52 is directly formed on one of the inner plate 10 and the second outer plate 30, and the other one of the second conductive bump 62 and the second plated bump 52 is directly formed on the other one of the inner plate 10 and the second outer plate 30. The risk of leakage of the electromagnetic wave signal from the space between the inner plate 10 and the first outer plate 20/the second outer plate 30 is thereby reduced.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. An electromagnetic wave transmission board comprising:
   an inner board defining a first through hole, wherein a wall of the first through hole is provided with a plated metal layer;
   a first outer plate disposed on a side of the inner board and covering one end of the first through hole;
   a second outer plate disposed on a side of the inner board away from the first outer plate and covering another end of the first through hole;
   a first plated bump disposed between the inner plate and the first outer plate, the first plated bump surrounding the first through hole;
   a first conductive bump sandwiched between the inner plate and the first outer plate, the first conductive bump surrounding the first plate bump;
   a first adhesive layer sandwiched between the inner plate and the first outer plate and located on a side of the first conductive bump away from the first plated bump;
   a second plated bump disposed between the inner plate and the second outer plate, the second plated bump surrounding the first through hole;
   a second conductive bump sandwiched between the inner plate and the second outer plate, the second conductive bump surrounding the second plated bump; and
   a second adhesive layer sandwiched between the inner plate and the second outer plate and disposed on a side of the second conductive bump away from the second plated bump;
   wherein the plated metal layer, the first plated bump, the first conductive bump, the first outer plate, the second plated bump, the second conductive bump, and the second outer plate cooperatively form a chamber, the electromagnetic wave transmission board is configured to transmit electromagnetic wave signal through the chamber.

2. The electromagnetic wave transmission board of claim 1, wherein the inner plate comprises a first conductive layer, a second conductive layer, and an insulating layer located between the first conductive layer and the second conductive layer; the first outer plate comprises a first base layer, a first conductive circuit layer, and a second conductive circuit layer, the first conductive circuit layer and the second conductive circuit layer are disposed on opposite surfaces of the first base layer; two ends of the first conductive bump are respectively connected to the first conductive layer and the first conductive circuit layer.

3. The electromagnetic wave transmission board of claim 2, wherein the second outer plate comprises a second base layer, a third conductive circuit layer, and a fourth conductive circuit layer, the third conductive circuit layer and the fourth conductive circuit layer are respectively disposed on opposite surfaces of the second base layer, two ends of the second conductive bump are respectively connected to the second conductive layer and the third conductive circuit layer.

4. The electromagnetic wave transmission board of claim 3, wherein the first conductive circuit layer defines a first groove exposing a portion of the first base layer, the first groove is interconnected with the chamber; the third conductive circuit layer defines a second groove exposing a portion of the second base layer, the second groove is interconnected with the chamber.

5. The electromagnetic wave transmission board of claim 3, wherein the first conductive layer or the first conductive circuit layer defines a third groove, an end of the first plated bump is accommodated in the third groove; the second conductive layer or the third conductive circuit layer defines a fourth groove, an end of the second plated bump is accommodated in the fourth groove.

6. The electromagnetic wave transmission board of claim 2, wherein the first conductive layer comprises a first shielding portion, the second conductive layer comprises a second shielding portion, the first shielding portion and the second shielding portion are respectively connected to two ends of the plated metal layer, the first conductive bump and the second conductive bump are respectively disposed on the first shielding portion and the second shielding portion.

7. The electromagnetic wave transmission board of claim 1, wherein the electromagnetic wave transmission board further comprises a plurality of first plated bumps which are spaced apart from each and surrounds the first through hole; or the electromagnetic wave transmission board further comprises a plurality of first conductive bumps which are spaced apart from each and surround the first plated bump; or the electromagnetic wave transmission board further comprises a plurality of second plated bumps which are spaced apart from each and surround the first through hole; or the electromagnetic wave transmission board further comprises a plurality of second conductive bumps which are spaced apart from each and surround the second plate bump.

8. The electromagnetic wave transmission board of claim 1, wherein the first outer plate defines a second through hole, the chamber is in communication with an external space through the second through hole, the second through hole is infilled with a filler to seal the chamber.

9. The electromagnetic wave transmission board of claim 1, further comprising an active element and an antenna respectively disposed on sides of the first outer plate and the second outer plate away from the inner plate, wherein the active element and the antenna corresponds in position to the chamber.

10. The electromagnetic wave transmission board of claim 1, wherein materials of the first conductive bump and the second conductive bump are conductive paste.

11. A method of manufacturing an electromagnetic wave transmission bord comprising:
providing an inner plate defining a first through hole penetrating through opposite sides thereof, a wall of the first through hole being provided with a plated metal layer;
providing a first substrate, electroplating a first plated bump on one of the first substrate and the inner plate, and printing a first conductive bump on the other one of the first substrate and the inner plate;
providing a second substrate, electroplating a second plated bump on one of the second substrate and the inner plate, and printing a second conductive bump on the other one of the second substrate and the inner plate;
providing a first adhesive layer with a first opening and a second adhesive layer with a second opening, wherein each of the first conductive bump and the first plated bump extends through the first opening, each of the second conductive bump and the second plated bump to extends through the second opening;
laminating the first substrate, the first adhesive layer, the inner plate, the second adhesive layer, and the second substrate together in that order, wherein the first plated bump is disposed between the inner plate and the first outer plate, the first plated bump surrounds the first through hole, the first conductive bump is sandwiched between the inner plate and the first outer plate, the first conductive bump surrounds the first plate bump, the second plated bump is disposed between the inner plate and the second outer plate, the second plated bump surrounds the first through hole, the second conductive bump is sandwiched between the inner plate and the second outer plate, the second conductive bump surrounds the second plated bump; and
forming a first outer plate and a second outer plate from the first substrate and the second substrate respectively.

12. The method of claim 11, wherein before laminating the first substrate, the first adhesive layer, the inner plate, the second adhesive layer, and the second substrate together in that order, the method further comprises:
forming a first groove on one of the first substrate and the inner plate where the first plated bump is not formed, the first groove accommodating an end of the first plated bump;
forming a second groove on one of the second substrate and the inner plate where the second plated bump is not formed, the second groove accommodating an end of the second plated bump.

13. The method of claim 11, wherein the first substrate comprises a first base layer, a first conductive circuit layer disposed on a side of the first base layer, and a third metal layer disposed on a side of the first base layer away from the first conductive circuit layer; the second substrate comprise a second base layer, a third conductive layer disposed on the second base layer, and a fourth metal layer disposed on a side of the second base layer away from the third conductive layer; the inner plate comprises a first conductive layer and a second conductive layer disposed outside;
wherein laminating the first substrate, the first adhesive layer, the inner plate, the second adhesive layer, and the second substrate together in that order comprises:
laminating a side of the first substrate having the first conductive circuit layer on the first conductive layer through the first adhesive layer; and
laminating a side of the second substrate having the third conductive circuit layer on the second conductive layer through the second adhesive layer.

14. The method of claim 13, wherein forming a first outer plate and a second outer plate from the first substrate and the second substrate respectively comprises:
forming a second conductive circuit layer from the third metal layer to obtain the first outer plate; and
forming a fourth conductive circuit layer from the fourth metal layer to obtain the second outer plate.

15. The method of claim 13, wherein the step of providing an inner plate defining a first through hole penetrating through opposite sides thereof, a wall of the first through hole being provided with a plated metal layer comprises:

provided a laminated structure comprising a first metal layer, a second metal layer, and an insulating layer disposed between the first metal layer and the second metal layer;

forming the first through hole penetrating the laminated structure;

forming a first conductive layer and a second conductive layer from the first metal layer and the second metal layer respectively, and electroplating the plated metal layer on the wall of the first through hole.

16. The method of claim 13, wherein the step of electroplating a first plated bump on one of the first substrate and the inner plate, and printing a first conductive bump on the other one of the first substrate and the inner plate comprises:

electroplating the first plated bump on the first conductive circuit layer, and printing the first conductive bump on the first conductive layer;

wherein after being laminated, two ends of the first conductive bump are respectively connected to the first conductive layer and the first conductive circuit layer.

17. The method of claim 16, wherein the step of electroplating a second plated bump on one of the second substrate and the inner plate, and printing a second conductive bump on the other one of the second substrate and the inner plate comprises:

electroplating the second plated bump on the second conductive layer, and printing the second conductive bump on the third conductive circuit layer;

wherein after being laminated, two ends of the second conductive bump are respectively connected to the second conductive layer and the third conductive circuit layer.

18. The method of claim 11, further comprising forming a second through hole on the first outer plate, wherein the second through hole is interconnected with the first through hole.

19. The method of claim 11, further comprising forming an active element and an antenna on the first outer plate and the second outer plate, respectively, wherein the active element and the antenna correspond in position to the first through hole.

* * * * *